United States Patent [19]
Lin

[11] Patent Number: 5,287,193
[45] Date of Patent: Feb. 15, 1994

[54] PARALLEL PROCESSING ARCHITECTURE OF RUN-LENGTH CODES

[75] Inventor: Yung-Chung Lin, Taipei, China

[73] Assignee: Industrial Technology Research Institute, Taiwan

[21] Appl. No.: 715,819

[22] Filed: Jun. 14, 1991

[30] Foreign Application Priority Data

Apr. 10, 1991 [CN] China .................... 80102843

[51] Int. Cl.⁵ ............................. H04N 1/419
[52] U.S. Cl. .................. 358/261.1; 358/426; 358/261.4; 382/56
[58] Field of Search .............. 358/261.1, 261.4, 426, 358/429, 464, 467, 470; 382/48, 56

[56] References Cited

U.S. PATENT DOCUMENTS

| | | | |
|---|---|---|---|
| 4,800,441 | 1/1989 | Sato | 358/261.1 |
| 4,885,576 | 12/1989 | Pennebaker | 382/56 |
| 5,008,951 | 4/1991 | Koshi | 382/56 |
| 5,038,381 | 8/1991 | Nelson | 358/261.1 |
| 5,067,023 | 11/1991 | Kim | 358/426 |

Primary Examiner—Edward L. Coles, Sr.
Assistant Examiner—Thomas D. Lee
Attorney, Agent, or Firm—Darby & Darby

[57] ABSTRACT

A parallel processing architecture of run length codes in an image processing system wherein the run-length codes are represented by the run-start addresses and the run-end addresses of black runs. The image data is loaded into this processing architecture by unit of words. A run detector in the parallel processing architecture detects if there are run-start or run-end bits in a word. When there are run-start bits or run-end bits present in a word, this parallel architecture employs a run-start row address generator and a run-end row address generator, which are all logic circuits and comprise a data flow hardware architecture, to generate run-start row addresses and run-end row addresses in parallel without the CPU intervening. A ripple counter is utilized to derive the crossing count parameter by counting the total number of black runs in a row of image data.

19 Claims, 5 Drawing Sheets

PARALLEL PROCESSING ARCHITECTURE OF RUN-LENGTH CODES

BACKGROUND OF THIS INVENTION

This invention relates to compression of image data, and more particularly to a novel architecture for processing run-length codes in parallel.

There is a need in image processing for compressing image data so that the information contained within the data may be stored in less memory space or transmitted at a higher rate. Image data is comprised of many rows of image data, and each row of image data is corresponding to the information on a document scanned by a scanning line of a scanner. Each row of image data comprises many bits each corresponding to a pixel on a scanning line. Usually, a bit with binary one level is corresponding to a black pixel representative of black or printed information on a document, and a bit with binary zero level is corresponding to a white pixel representative of white or background information on a document. A row of image data is divided into runs, i.e., strings of signals of the same value. Conventionally, a black run representative of printed information can be represented by a run-length code word comprising a run-start address indicating the position where a run starts in a row and, the number of signals in the run so that a row of original image data can be converted into vectorized data to accomplish the object of image data compression.

A run length code processor may be designed to process original image data bits which are inspected in blocks, called word. Then, the position of a changing bit whose signal value is different from that of the previous bit in the word is first calculated and the run-length is determined. From these input run-lengths, the processor generates the addresses of the code table memory and generates appropriate code words by looking up the code table memory. When decoding, the decoder generates the addresses of the code table memory from input code words, and generates run-lengths by looking up the code table memory. One example of this technique is HITACHI's DICEP (Document Image Compression and Expansion Processor), HD63085.

Unfortunately, it takes a lot of time for a computer to execute this algorithm based on encoding and decoding by software technology.

SUMMARY OF THIS INVENTION

The present invention is directed to a parallel processing architecture of run-length codes, each of which is represented by the run-start row address and the run-end row address of a black run in a row of image data. The definition of run-length codes in the invention is different from that of a conventional one, but the object of compressing image data by vectorization is the same. In accordance with the invention, the image data is loaded in by unit of words from a CPU, and, without the CPU intervening, the run-start and run-end bits of all black runs in the word are detected in parallel and then converted into run-start and run-end addresses in a row of image data which are stored in series in two pipelines of first-in-first-out (FIFO) registers so that the CPU can access the run-start and run-end row addresses, i.e., run-length codes, for further image processing.

This invention may be also characterized in that it comprises a ripple counter for quickly acquiring the crossing count, which is defined as the total change times from white to black information, i.e., the total number of black runs, in a row of image data. The crossing count, which is an important parameter for image processing techniques, such as the segmentation and the feature extraction. is conventionally derived by software technology at a low processing rate.

This invention may be further characterized in that it comprises a run-detector for detecting the condition that there is neither run start bit nor run end bit in a word and thus an interrupt message is generated therefrom to inform the CPU to load in the image data of the next word so as to improve the data compression rate. A run-start bit is defined as the bit whose value is 1 and the preceding bit is 0, and a run-end bit as the bit whose value is 0 and the preceding bit is 1.

In accordance with the preferred embodiment of this invention, the method and the apparatus, for implementing a parallel processing architictare of run-length codes, comprising:

(1) first inputting the bits of one word of a row of image data stored in system memories, and indicating the word start address in the row of image data with a pointer;

(2) detecting the existence of a run start bit and the existence of a run-end bit in the word in parallel and, on detection of the lack of both run-start bits and run-end bits, generating an interrupt signal to inform the CPU to load in the image data of the succeeding word with a run detector;

(3) when the existence of a run start bit is detected, generating run-start levels of a word in parallel with a run-start level generator by designating each of the run-start bits as a first binary level and each of the other bits in the word as a second binary level;

(4) when the existence of a run end bit is detected, generating run-end levels of a word in parallel with a run-end level generator by designating each of the run-end bits as a first binary level and each of the other bits as a second binary level; the run start levels and the run-end levels being generated in parallel;

(5) converting the run-start levels and the run-end levels to a plurality of trapped run-start word position pulses each corresponding to the position of a run-start bit in a word and, a plurality of trapped run-end word position pulses each corresponding to the position of a run-end bit in a word, with a first and a second trap circuits respectively; the two trap circuits employing a data flow hardware scheme;

(6) encoding the outputs of the first and the second trap circuits to generate run-start word addresses serially each indicative of the position of a run-start bit in a word and run-end word addresses serially each indicative of the position of a run-end bit in a word, in the form of numerical binary codes with a first and a second encoders respectively;

(7) adding the run-start word addresses and run-end word addresses with the word start address from the pointer in a first and a second adding circuits to generate the run-start row addresses and the run-end row addresses of the run-start bits and the run-end bits in a row of image data respectively;

(8) storing the run-start and run-end row addresses serially into a first and a second pipeline of FIFO registers respectively so that the CPU can access these addresses, i.e., run-length codes, for further image processing.

DETAILED DESCRIPTION OF THIS INVENTION

Figure 1:
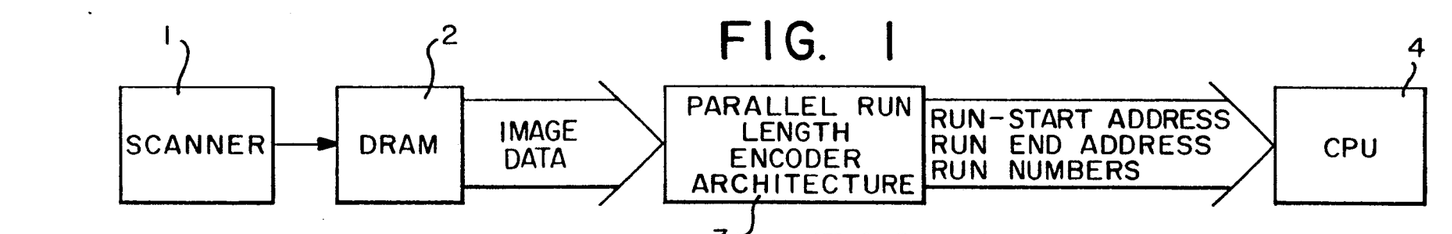
FIG. 1 is a block diagram of an image processing system which includes a parallel processing architecture of run-length codes in accordance with this invention.

Referring to FIG. 1, an image processing system includes a scanner 1 for deriving digitized image data by scanning information on a document and system memories DRAM's 2 for storing the digitized image data representative of text or graphic information. Controlled by a central processing unit (CPU), the digitized image data is then loaded word by word into a parallel processing architecture of run-length codes 3 to generate run-length codes comprising run-start and run-end row addresses in a row of image data in parallel. The crossing count, an important parameter for image processing techniques, is also derived in the parallel processing architecture of run-length codes 3. A central processing unit 4 receives the run-length codes and the crossing count from the parallel processing architecture 3 to perform further image processing, e.g., optical character recognition (OCR).

Figure 2:
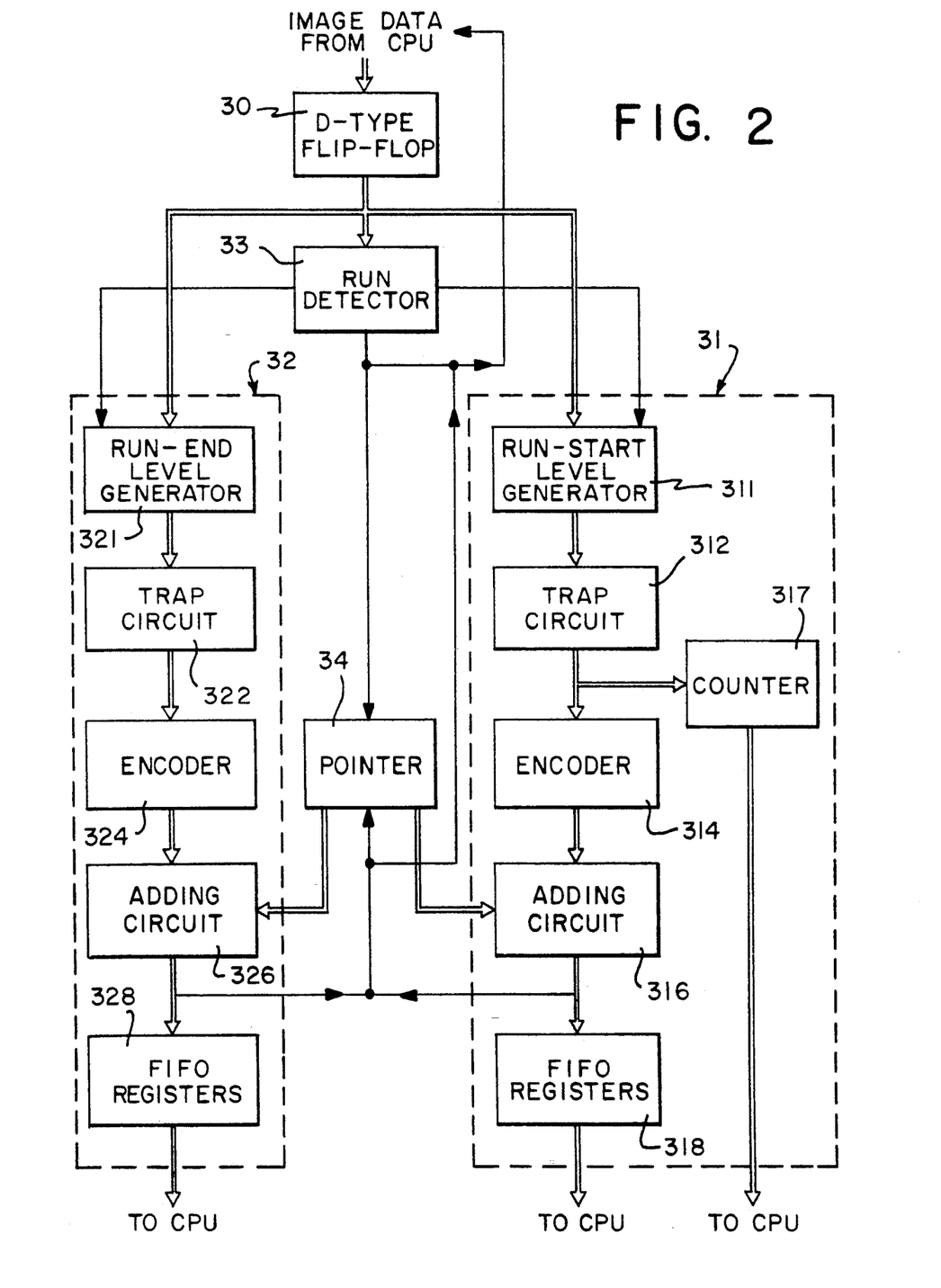
FIG. 2 is a detailed block diagram of an embodiment of the parallel processing architecture of run-length codes.

FIG. 2 is a block diagram of an embodiment of the parallel processing architecture of run-length codes 3. This parallel processing architecture 3 is mainly comprised of two address generators 31 and 32: one for generating the run-start row addresses of all runs in a row of image data and the other for generating the run-end row addresses. When a CPU loads the image data of a word into this parallel processing architecture 3, a plurality of D-type flip-flops 30 latch the image data and transmit the output to a run detector 33 for detecting whether there are run-start bits or run-end bits in the word. A run-start bit is defined as a bit whose bit value is 1 and its preceding one is 0, and a run-end bit is defined as a bit whose bit value is 1 and its suceeding one is 0. As there is a run-start bit or more present in the word, the address generator 31 is activated by the run detector 33 for processing; and as there is a run-end bit or more present in the word, the address generator 32 is activated by the run-detector 33. As the run detector 33 notes the lack of both run-start bits and run-end bits in a word, the two generators 31 and 32 will not be activated and the run detector 33 will generate a pulse signal to inform the CPU to load in the image data of the succeeding word for further prosecution, so as to reduce the waiting time of the CPU and to improve the rate of image data compression. This architecture 3 further comprises a pointer 34 for indicating the word start address, the position of the first bit of a word under processing in a row of image data. The central signal from the run detector 33 to inform the CPU for loading the next word is the same as the signal for controlling the pointer 34.

The hardware scheme and operating principles of two generators 31 and 32 are very similar. The run-start address generator 31 comprises a run-start level generator 311, a trap circuit 312, an encoder 314, an adding circuit 316 and a pipeline of first-in-first-out registers 318. The run-end address generator 32 comprises a run-end level generator 321, a trap circuit 322, an encoder 324, an adding circuit 326 and a pipeline of first-in-first-out registers 328. This invention is further characterized in that it comprises a ripple counter 317 which can be connected to either the trap circuit 312 in the generator 31 or the trap circuit 322 in the generator 32 to derive the crossing count.

The pointer 34 updates its content to indicate the word start address of a succeeding word by adding the bit number of a word to its original content under the condition that the run detector 33 notes no run-start bits and run-end bits in a word or that the run-length codes of all runs in a word have been all generated. The bit number of a word is related to the storage unit of a computer and could be the value of 4, 8, 16, or 32.

When receiving the image data of a word in parallel, the run detector 33 performs logic operations to detect whether the bits are all 1's or all 0's. If they are not, there must be run start bits in the word under processing and the run detector 33 will generate a control signal to activate the run-start level generator 311. If the bits of a word under processing are all 1's, the first bit of the word could be a run-start bit provided that the last bit of the preceding word, defined as feed back bit (FDB), is 0. In such a case, the run-start level generator 311 also should be activated for processing. So, the bit FDB must be input to the run detector 33 together with the word under processing for exactly detecting the existance of run-start bits.

At the same time, the run detector 33 will generate a control signal to activate the run-end level generator 321 when there is a run-end bit or more in a word. When the bits of a word are not all 1's or 0's, there must be run-end bits in the word. While the bits of a word under processing are all 0's and FDB is 1, the feed back bit is a run-end bit. As to the last bit of the very word under processing, it can not be determined whether it is a run-end bit until compared with the first data bit of the succeeding word.

The relationships between the bit values of a word under processing and the FDB, and the number of run-start bits and run-end bits are listed in the following table.

| FDB | image data of a word under processing | number of run-start bits | number of run-end bits |
|---|---|---|---|
| 1 | not all 1's or 0's | to be decided | to be decided |
| 0 | not all 1's or 0's | to be decided | to be decided |
| 1 | all 1 | 0 | 0 |
| 1 | all 0 | 0 | 1 (FDB) |
| 0 | all 1 | 1 | 0 |
| 0 | all 0 | 0 | 0 |

The table above shows that when the bit values of FDB and the image data of a word under processing are all 0's or all 1's there is neither a run-start bit nor a run-end bit. Under such conditions, the run detector 33 will send an interrupt signal to inform the CPU to load in the succeeding word for further processing and update the word start address content of the pointer 34, so that a large amount of processing time can be saved accordingly than would otherwise be the case. When the interrupt signal is generated, the last bit of the word under processing will be latched as a feed back bit for being processed together with the succeeding word.

The run-start level generator 311 is a logic circuit activated by the run detector 33 which also receives the image data of a N-bit word in parallel together with the FDB and performs logic operations to determine the run start bits and to designate the run start bits as first binary levels and the others bits in a word as second binary levels. The logic equation can be shown below.

$$ST_n = /DB_{n-1} * DB_n, 0 \leq n \leq N-1 \tag{1}$$

wherein $DB_{n-1}$ and $DB_n$ are two succeeding bits in the word, $DB_{n-1}$ the former one, $DB_n$ the latter one, $ST_n$ is the binary level value of the nth bit in the run start levels, and the symbol "*" represents an AND logic operation, "/" an inverse logic operation. The calculated results can be seen from the following table.

| $DB_{n-1}$ | $DB_n$ | $ST_n$ |
|---|---|---|
| 0 | 0 | 0 |
| 0 | 1 | 1 |
| 1 | 0 | 0 |
| 1 | 1 | 0 |

As shown in the table, only when $DB_{n-1}$ is 0 and $DB_n$ is 1 will be the bit $ST_n$ of the run-start levels have a high level. This means that only when information changes from white to black, will the corresponding bit of the dark pixel, called a run-start bit, have a value of 1 in the run-start levels.

After generated by the run-start level generator in parallel, the run-start levels ($ST_n, 0 \leq n \leq N-1$) are transmitted to a trap circuit 312. The trap circuit 312 comprises pulse steering circuits connected as a novel data flow hardware architecture so that the input run start levels in parallel can be converted into run-start word position pulses each corresponding to a position of a run start bit in a word. The trap circuit 312 also comprises D-type flip-flops to trap the run-start word position pulses for encoding.

The output from the trap circuit 312 then are transmitted to the encoder 314 for encoding them in the form of serial numerical binary codes, run-start word addresses, each indicative of a relative position of a run-start bit in a word. Then, by an adding circuit 316, the serial run-start word addresses in a word are added with the word start address from the pointer 34, and thus the run-start row addresses in a row of image data are derived. Finally, the run-start row addresses in a row of image data are serially input into a pipeline of first-in-first-out registers 318 so that the CPU can access these addresses, the vectorized image data, for further image processing.

A ripple counter 317 can be connected to the trap circuit 312 to derive the crossing count by counting the trapped pulses output from the trap circuit 312.

The operating principles of the run-start address generator 31 correspond to the run-end address generator 32, except that run-start addresses are processed instead of run-end addresses.

When activated by the run detector 33, the run-end level generator 321, which is a logic circuit, performs logic operations to detect run-end bits and thus to generate run end levels. The logic equation to detect the run-end bits performed by the run detector 33 is shown as follows.

$$EN_{n-1} = DB_{n-1} * /DB_n, 0 \leq n \leq N-1 \tag{2}$$

wherein $EN_{n-1}$ is the run-end level corresponding to the FDB. Since the run-end level corresponding to an image data bit is determined by comparing its bit value with the suceeding one, so that the polarity of the run-end level corresponding to the last bit of a word under processing can't be determined until the next word is loaded in. The truth table of the logic equation (2) is shown below.

| $DB_{n-1}$ | $DB_n$ | $EN_{n-1}$ |
|---|---|---|
| 0 | 0 | 0 |
| 0 | 1 | 0 |
| 1 | 0 | 1 |
| 1 | 1 | 0 |

And in a similar operation sequence to the run-start address generator 31, the output of the run-end level generator 321 in the run end address generator 32 are then transmitted to the trap circuit 322. Through the encoder 324 and the adding circuit 326, the run-end row addresses in a row of image data are serially derived and input to the pipeline of first-in-first-out registers 328 so that the CPU can access them for further image processing.

When the run-start and run-end row addresses of all runs in a word are all generated serially, or when the run detector 33 detects there is neither run-start bit nor run-end bit in a word, there is a signal generated to inform the CPU to load in the data bits of the next word for further processing and to latch the last bit of the word under processing as a feed back bit.

A preferred embodiment of the invention employs a 16-bit CPU, which is illustrated with reference to FIG. 3 to FIG. 8 mainly for generating the run-start addresses.

Figures 3, 8:
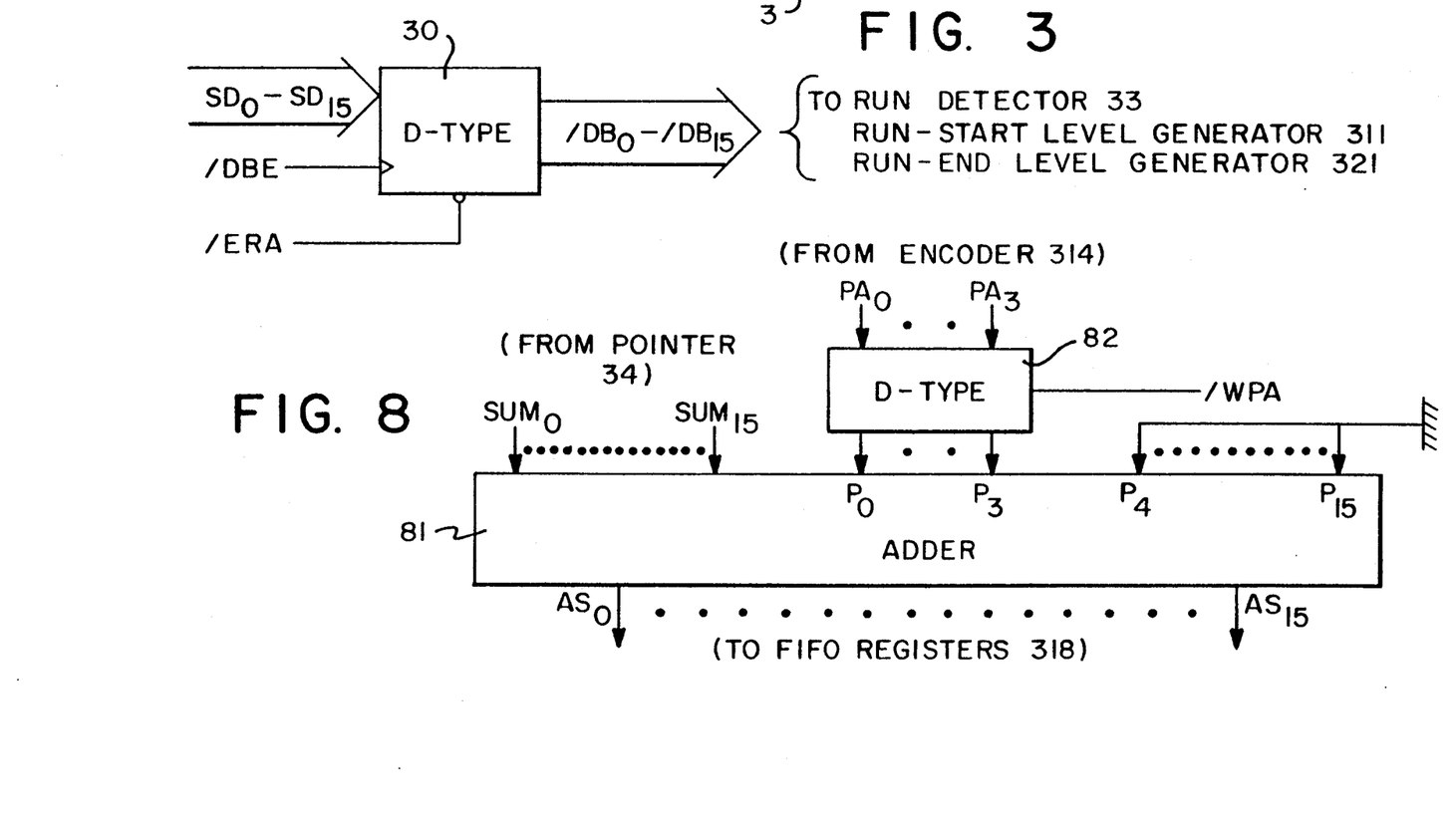
FIG. 3 is an illustrative diagram of a plurality of D-type flip-flops forming part of the preferred embodiment of the parallel processing architecture of run length codes.
FIG. 8 is a circuit diagram of an adding circuit 316 forming part of the preferred embodiment of the parallel processing architecture in accordance with this invention.

In FIG. 3, the 16-pixel image data, $SD_0$ to $SD_{15}$, of a word are loaded from a CPU to a plurality of D-type flip-flops 30 by a data bus enable signal /DBE. With an enable run address signal /ERA, which is the enabling signal of this processing architecture 3, the image data bits $SD_0$ to $SD_{15}$ are latched and output as $/DB_0$ to $/DB_{15}$ which are input to the run detector 33.

Figure 4:
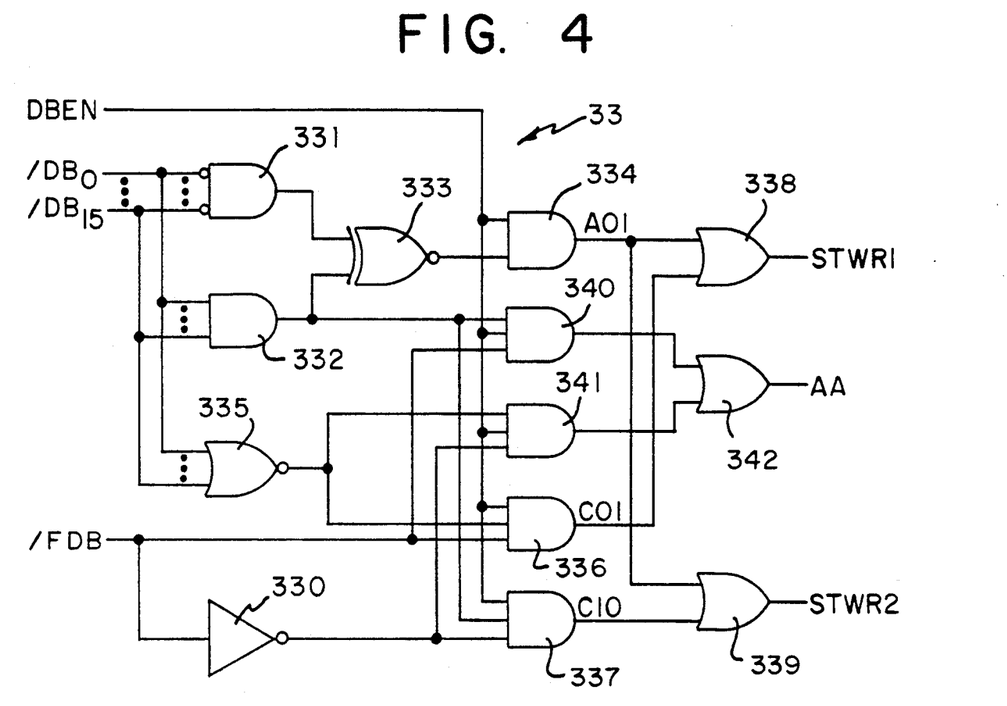
FIG. 4 is a logic circuit diagram of a run detector forming part of the preferred embodiment of the parallel processing architecture in accordance with this present invention.

FIG. 4 is a logic circuit diagram of the run detector 33. DBEN, a pulse produced from the CPU write signal, is the enabling control signal of this circuit; and FDB, the feed back bit, is the last bit of the previously processed word. The inverse levels of 16 bits of a word, /DB$_0$ to /DB$_{15}$ are input to a gate 331 and an AND gate 332 simutaneously to detect whether the 16 bits are all 1's or all 0's. The outputs of gates 331 and 332 are input to an EXNOR gate 333. The output of the EXNOR gate 333 is then connected to an AND gate 334 to perform an AND logic operation with the enabling control pulse signal DBEN. Through the above-mentioned gates 331 to 334; When the data bits of a word are not all 1's or all 0's, a pulse signal A01 will be generated at the output terminal of the AND gate 334. The /DB$_0$ to /DB$_{15}$ are input to a NOR gate 335, too. An AND gate 336 performs an AND operation on the output of a NOR gate 335, the inverse level signal /FDB, and the pulse signal DBEN in order to generate a positive pulse signal C01 under the condition that /DB$_0$ to /DB$_{15}$ are all low levels and /FDB is a high level, i.e., the the feed back bit is 0 and the data bits of a word are all 1's. An AND logic gate 337 performs and AND operation on the level signal FDB and the output of the AND gate 332 and a pulse signal DBEN in order to generate a positive pulse signal C10 under the condition that /DB$_0$ to /DB$_{15}$ are all high level signals and /FDB is a low level, i.e., that the feedback bit is 1 and the data bits of a word are all 0's. Finally, an OR gate 338 performs an OR logic operation on the outputs from gates 334 and 336 so that a positive pulse signal STWR1 is derived when there is a run start bit or more in the word. An OR.gate 339 performs an OR logic operation on the outputs from gates 334 and 337 so that a positive pulse signal is derived when there is a run-end bit or more in the word. The pulse signals STWR1 and STWR2 are the control signals for activating the run-start address generator 31 and the run-end address generator 32 respectively. The logic equations for generating the foregoing five pulse signals and their logic table are listed below:

$$A01 = [(DB_0 * DB_1 * \ldots * DB_{15}) \odot (/DB_0 * DB_1 * \ldots * /DB_{15})] * DBEN \quad (3);$$
$$C01 = FDB * DB_0 * DB_1 * \ldots * DB_{15} * DBEN; \quad (4)$$
$$C10 = FDB * /DB_0 * /DB_1 * \ldots * /DB_{15} * DBEN; \quad (5)$$
$$STWR1 = A01 + C01; \quad (6)$$
$$STWR2 = A01 + C10; \quad (7)$$

wherein "⊙" represents an EXNOR logic operation and "+" is an OR logic operation

| FDB | DB$_0$ to DB$_{15}$ | A01 | C01 | C10 | STWR1 | STWR2 |
|---|---|---|---|---|---|---|
| 0 | not all 1's or 0's | 1 | 0 | 0 | 1 | 1 |
| 1 | not all 1's or 0's | 1 | 0 | 0 | 1 | 1 |
| 0 | all 0 | 0 | 0 | 0 | 0 | 0 |
| 0 | all 1 | 0 | 1 | 0 | 1 | 0 |
| 1 | all 0 | 0 | 0 | 1 | 0 | 1 |
| 1 | all 1 | 0 | 0 | 0 | 0 | 0 |

As shown in the logic table above, when the FDB and DB$_0$ to DB$_{15}$ are all 1's or all 0's, i.e., when there is neither run-start bits nor run-end bits in the FDB and the word, the run detector 33 will send a pulse signal AA to the CPU so that the CPU can load in the image data of the succeeding word for processing. The logic equation to generate the pulse signal is:

$$AA = (/FDB * /DB_0 * /DB_1 * \ldots * /DB_{15} * DBEN) + (FDB * DB_0 * DB_1 * \ldots * DB_{15} * DBEN) \quad (8)$$

Logic gates 340, 341 and 342 are provided for generating the control signal AA.

Figure 5:
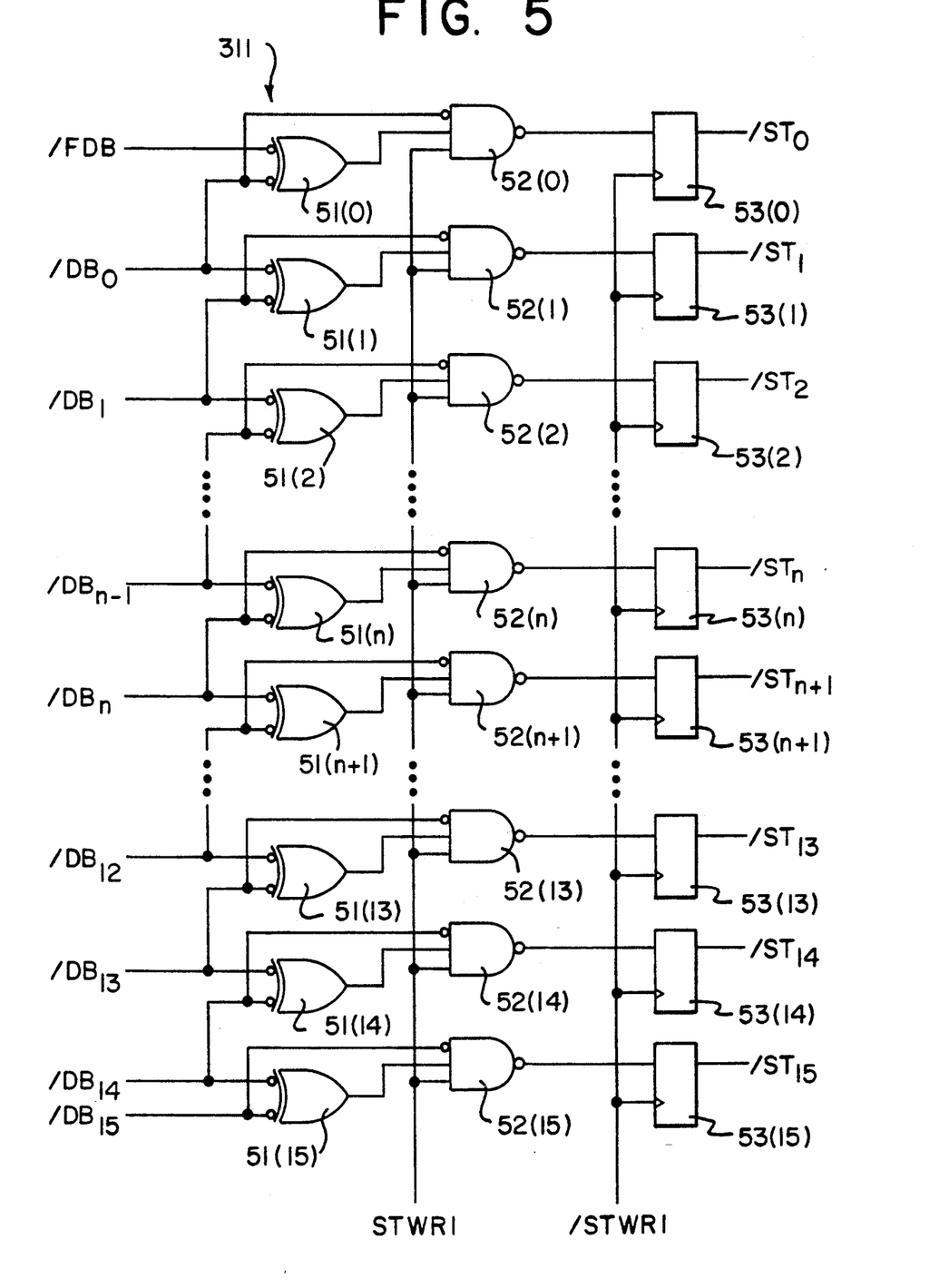
FIG. 5 is a logic circuit diagram of a run-start level generator forming part of the preferred embodiment of the parallel processing architecture in accordance with this invention.

Now refer to FIG. 5 for the run-start level generator 311. Here, the inverse run-start levels /ST$_0$ to /ST$_{15}$ are to be generated in parallel from /FDB, /DB$_0$ to /DB$_{15}$. This generator 311 is a logic circuit activated by the pulse signal STWR1 and is comprised of 16 stages, each of which comprises an EXOR gate 51, a NAND gate 52 and a D-type flip-flop 53. The bit DB$_{n-1}$ is input to an EXOR gate 51($n$) with the succeeding bit DB$_n$. By connecting this EXOR gate 51($n$) to a NAND gate 52($n$) again with DB$_n$ and the enabling pulse signal STWR1, a negative pulse is derived at the output terminal 52($n$) when DB$_{n-1}$ is 0 and DB$_n$ is 1; otherwise, the output terminal 52($n$) derives a high level signal. With a signal /STWR1, which is a delayed inverse pulse signal of STWR1, a D-type flip-flop 53($n$) will latch the negative pulse signal from 52($n$) and output a low level signal, and will remain the high level signal output from 52($n$). Thus, the inverse run start levels, ST$_n$ (0≦n≦15), are derived at the output terminal of 53($n$). The logic equation of this logic circuit is equivalent to the foregoing equation (1) and is expressed as follows:

$$ST_n = (DB_{n-1} \oplus DB_n) * DB_n \quad (9)$$

wherein the symbol "⊕" represents an EXOR operation.

As to the run-end level generator 321, which is also a logic circuit, the bit DB$_{n-1}$ is also input to an EXOR gate with the succeeding bit DB$_n$ while this EXOR gate is connected to a NAND gate not with DB$_n$ as in the run-start level generator 311, but with DB$_{n-1}$. This logic circuit 321 is activated by the pulse signal STWR2 from the run detector 33, and thus outputs inverse run-end level signals /EN$_n$. Accordingly, the logic equation performed by this generator 321 can be expresses as below:

$$EN_{n-1} = DB_{n-1} \oplus DB_n * DB_{n-1} \quad (10)$$

which is an equivalent equation to the foregoing equation (2).

Figure 6:
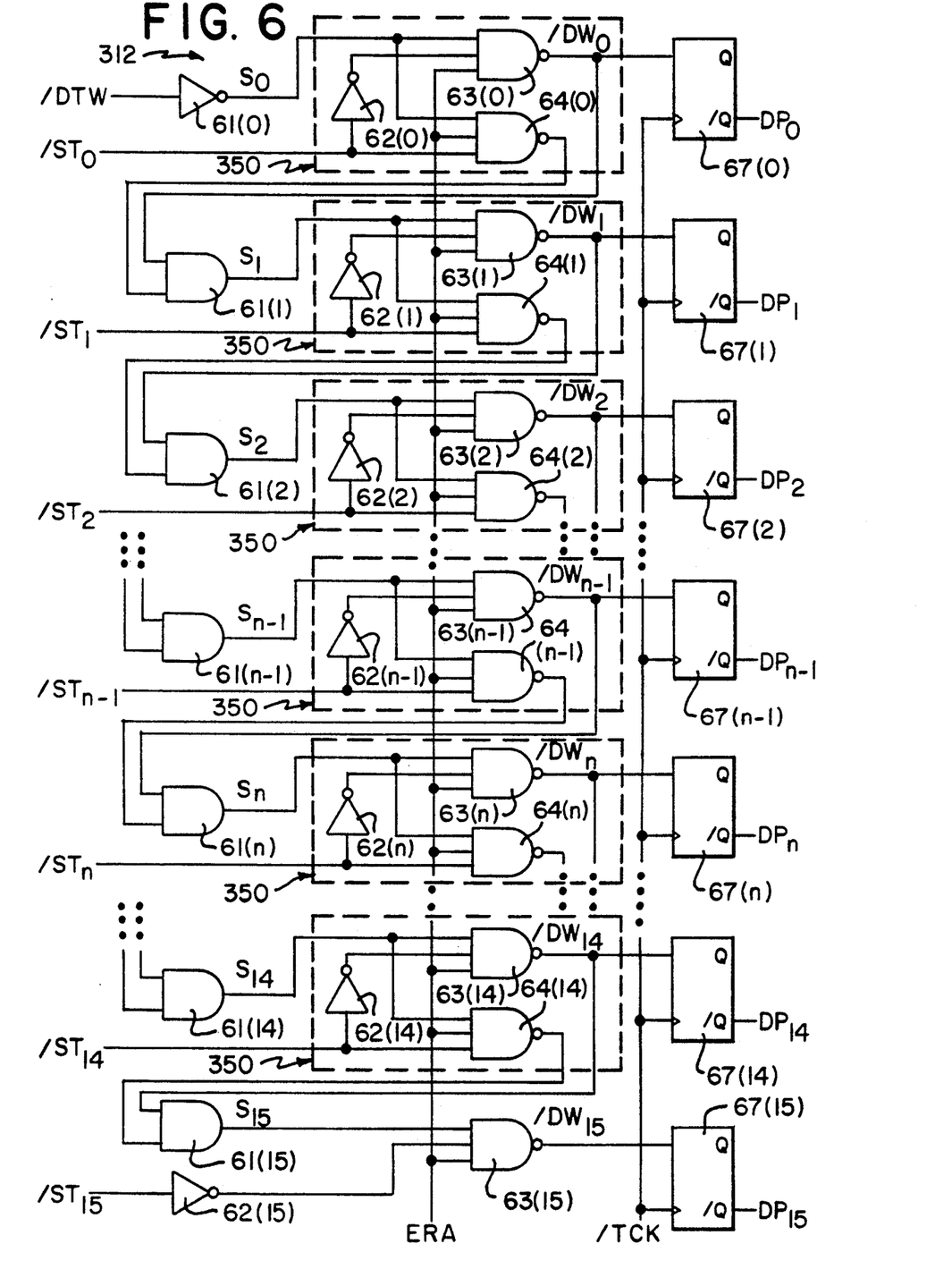
FIG. 6 is a logic circuit diagram of a trap circuit forming part of the preferred embodiment of the parallel processing architecture in accordance with this invention.

The inverse run-start levels, /ST$_0$ to /ST$_{15}$, are then transmitted to the trap circuit 312 as shown in FIG. 6. The trap circuit 312 comprises 16 stages, each of which comprises a NAND gate 61 for generating a pulse, a D-type flip-flop 67, and a pulse steering circuit composed of two NAND gates 63, 64 and an inverter 62, except that the first stage utilizes an inverter 61(0) instead of a NAND gate and the last stage is without a NAND gate 64. Every two succeeding stages are connected by connecting the output terminals of the two NAND gates 63(n−1), 64(n−1) in the (n−1)th stage to the NAND gate 61($n$) in the nth stage.

The ERA level signal is an enabling signal of this circuit 312 and /DTW is a delayed signal of /STWR1. This negative pulse signal /DTW is inversed by an inverter 61(0) so that a positive signal So is derived. So is transmitted to the two NAND gates 63(0) and 64(0) of a pulse steering circuit. /ST$_0$ level signal is sent to 64(0) and also through an inverter 62(0) to 63(0). If /ST$_0$ is a low level signal, i.e., it corresponds to a run-start bit, the output of 63(0) will derive a negative pulse /DW$_0$, and the output of 64(0) will remain a high level signal. On the contrary, while /ST$_0$ is a high level signal, then there is still a high level signal at the output terminal of 63(0) and a negative pulse at the output terminal of 64(0). The output terminals of 63(0) and 64(0) are then connected to the NAND gate 61(1) of the next stage. Since there is one, and only one negative pulse sent from the two NAND gates 63(0) and 64(0) to the NAND gate 61(1), there must be a positive pulse $S_1$ generated at the output terminal of 61(1). The $S_1$ pulse signal is a delayed signal of $S_0$ due to the pulse transmitted path of the special interconnection between the two stages and $S_1$ continues to activate the pulse steering circuit composed of 61(1), 63(1) and 64(1) to determine the output of $/DW_1$.

Generally speaking, the 61(n) NAND gate in the n-th stage of the trap circuit 312 receives the outputs from the pulse steering circuit of the preceding stage and thus generates a positive pulse $S_n$. $S_n$ pulse signal is then sent to the NAND gate 63(n) through an inverter 62(n) and to the NAND gate 64(n). This $/ST_n$ level signal from the run-start level generator 311 determines the outputs of 63(n) and 64(n). If the $/ST_n$ corresponding to a run start bit, then there is a negative pulse signal $/DW_n$ at the output terminal 63(n); otherwise, the output of 63(n) remains a high level signal. The pulse transmitted path from a stage to its succeeding stage forms a data flow hardware architecture so that the run-start level input in parallel are converted into pulses corresponding to the positions of the run-start bits in a word. The data flow architecture implemented by logic circuit is a characteristic in this invention. Each stage in the trap circuit 312 comprises a D-type flip-flop 67(n) which connects to the output of 63(n). With the /TCK clock signals, the OR sum of the delayed inverse pulse signals of $S_0$ to $S_{15}$, the /Q terminal of 67(n) can output $DP_n$ signal which has 16 stages. If $/ST_n$ is a low level signal and corresponds to a run-start bit, the n-th state of $DP_n$ is 1 and the other states are all 0's. If $/ST_n$ is a high level signal, then the 16 states of $DP_n$ are all 0's. Thus, the trap circuit 312 converts the run-start levels input in parallel into trapped run-start word position pulses each indicating a position of a run-start bit in a word.

The output signals from the trap circuit 312, $DP_0$ to $DP_{15}$ are then sent to a 16-4 encoder 314 for encoding the $DP_0$ to $DP_{15}$ to a series of hexadecimal codes, run-start word addresses, each denoted by $PA_0$ to $PA_3$ and indicative of the position of a run-start bit in a word. The clock signals, /WPA, utilized by the encoder 314 are the delayed signals of /TCK clock signals.

At the same time, $DP_0$ to $DP_{15}$ are sent to a ripple counter 317 comprising 16 D-type flip-flops connected in series and thus the run number of a word is derived. The ripple counter 317 can handle up to $2^{16}$ numbers and, it accumulates the number of all runs in a row of image data and then transmits this crossing count parameter to the CPU for further image processing.

Figure 7:
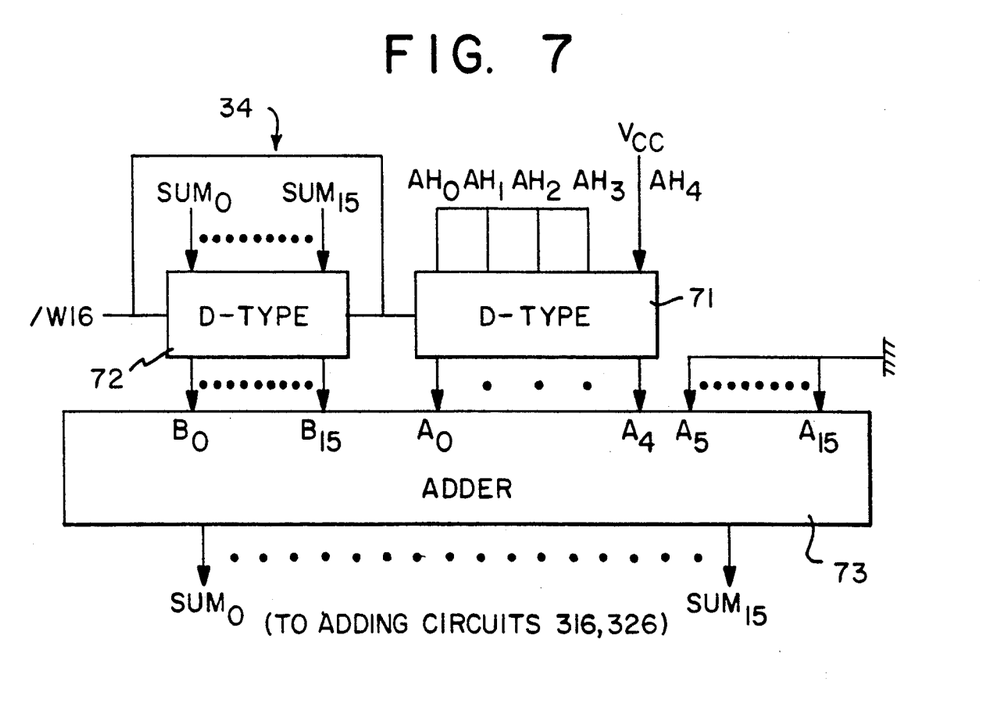
FIG. 7 is a circuit diagram of a pointer 34 forming part of the preferred embodiment of the parallel processing architecture in accordance with this present invention.

FIG. 7 shows a 16-bit pointer 34 which can also handle up to $2^{16}$ numbers. It comprises two D-type flip-flops 71, 72 and an adder 73. $AH_0$ to $AH_3$ are in ground states representative of low levels and $AH_4$ with a Vcc voltage representative of a high level so that $AH_0$ to $AH_4$ together denote the number sixteen. The word start address of a word under processing in a row of image data is denoted by the 16 bits, $SUM_0$ to $SUM_{15}$, and sent to the D-type flip-flop 72. The two flip-flops 71 and 72 are controlled by /W16 signal. The flip-flop 72 outputs $B_0$ to $B_{15}$ and the flip-flop 71 outputs $A_0$ to $A_4$ to the adder 73 with a control pulse signal /W16, and $A_5$ to $A_{15}$ are in ground states so that $A_0$ to $A_{15}$ still represent the number 16. After added in the adder 73, the sixteen bits $SUM_0$ to $SUM_{15}$ are updated to represent the word start address of a succeeding word in a row of image data, /W16 is generated under the condition that the run detector 33 detects that there is neither run start bit nor run-end bit in a word under processing, or under the condition that the run-start row addresses and the run-end row addresses of all black runs in a word are all generated. The logic equation to generate /W16 can be shown as:

$$/W16: /AA * /ASW * /ASW',$$

wherein /ASW is a negative pulse signal generated when the run-start row address of the last run-start bit in a word is derived. /ASW signal is derived from the delay of the last clock signal of /WPA. In a similar way, the /ASW' signal is a negative pulse signal generated when the run-end row address of the last run-end bit in a word is derived. The pulse signal /W16 is also the signal to inform the CPU to load in the image data of the succeeding word and the signal to latch the last bit of the word under processing as the FDB to be detected with the succeeding word through a D-type flip-flop.

The bit values of $SUM_0$ to $SUM_{15}$ are sent to an adding circuit 316 as illustrated in FIG. 8. The adding circuit 316 includes an adder 81 and a D-type flip-flop 82. The D-type flip-flop 82, which is controlled by /WPA clock signals, receives the input $PA_0$ to $PA_3$ serial codes, run-start word addresses from the encoder 314 and then outputs the serial codes, each denoted by $P_0$ to $P_3$, to the adder 81. $P_4$ to $P_{15}$ are all in ground states. In the adder 81, $P_0$ to $P_{15}$ denote the position of a run-start bit in a word and are added with the data $SUM_0$ to $SUM_{15}$ from the pointer 34 indicative of the word start address of the word under processing. Thus, the run-start addresses of all runs in a word, each denoted by $AS_0$ to $AS_{15}$, are serially derived at the output terminal of the adder 81 and serially stored into a pipeline of first-in-first-out registers 318.

The pipeline of first-in-first-out registers can be designed to be capable of holding all the run-start addresses in a row of image data. For example, in a document of A4 size, i.e., $8.3 \times 11.8$ (inches), there are about 2490 pixels in a row of image data when the document is scanned by a scanner of 300 dpi (dot per inch). Under this condition, the pipeline registers 318 with 512 stages should be enough for holding the run-start row addresses of all runs in a row of image data. If the pipeline registers 318 are full, /FF (Full Flag) signal is sent to the CPU for processing.

As to the run-end address generator 32 which includes a run-end level generator 321, a trap circuit 322, an encoder 324, and adding circuit 326 and a pipeline of FIFO registers 328, the operating principles and implementation structures of it correspond to counterparts in the run-start address generator 31 except that run-end addresses are processed instead of run-start addresses.

The ripple counter counts the total number of black runs by counting the trapped pulses output from the trap circuit 312. Since a trapped pulse is corresponding to a run-start bit of a black run in the preferred embodiment, it may not be possible to count the total number of white runs of which the bits are all corresponding to level signals. If the parallel processing architecture in the invention is to process the run-start and run-end addresses of white runs, the ripple counter is utilized to count the total number of white runs accordingly.

In the foregoing, there has thus been disclosed methods and an apparatus for processing run-length codes in parallel and deriving the crossing count parameter for image processing in an image processing system. In addition, a preferred embodiment mode with a 16-bit CPU has been set forth in detail for illustration only and not to limit this present invention. The scope of this invention is set forth in the appended claims.

What is claimed is:

1. A run-length code processing method of generating in parallel run-start row addresses and run-end row addresses of all black runs in a row of digitized image data, the image data being input by unit of N-bit words wherein N is an integer and relates to a storage unit of a computer, the metnod comprising the steps of:

(1) first inputting all bits of a word in a row of image data with control of a central processing unit of a computer, and indicating a word start address of said word in the row of image data;
   (2) detecting presence of a run-start bit and presence of a run-end bit in said word in parallel;
   (3) generating run-start levels from said bits of the word in the row of image data on detection of the presence of a run-start bit in said word by designating each of run-start bits as a first binary level and each of the other bits in the word as a second binary level;
   (4) generating run-end levels from said bits of the word in the row of image data on detection of the presence of a run-end bit in said word by designating each of run-end bits as a first binary level and each of the other bits in the word as a second binary level; said run-start levels and said run-end levels being generated in parallel;
   (5) converting in parallel the run-start levels and the run-end levels to a plurality of trapped run-start word position pulses each corresponding to the position of a run-start bit in the word and a plurality of trapped run-end word position pulses each corresponding to the position of a run-end bit in the word;
   (6) encoding in parallel said plurality of trapped run-start word position pulses and said plurality of trapped run-end word position pulses to generate serial run-start word addresses each indicative of the position of a run-start bit in the word and serial run-end word addresses each indicative of the position of a run-end bit in the word;
   (7) adding said run-start word addresses and said run-end word addresses with the word start address respectively to generate the run-start row addresses and the run-end row addresses;
   (8) storing the run-start row addresses and the run-end row addresses serially into first and second memory means.

2. A run-length code processing method according to claim 1, further comprising the step of:
   generating thereof an interupt signal to inform the central processing unit to load in a succeeding word for further processing on detection of in lack of both run-start bits and run-end bits in the word.

3. A run-length code processing method according to claim 1, further comprising the step of:
   counting a total number of the trapped run-start word position pulses generated in the row of image data to derive a crossing count parameter for further image processing.

4. A run-length code processing method according to claim 1 further comprising the step of:
   counting a total number of the trapped run-end word position pulses generated in the row of image data to derive a crossing count parameter for further image processing.

5. In an image processing system, an apparatus for separating run-start row addresses and run-end row addresses of black runs in a row of image data, the image data stored in system memories being loaded in by unit of N bit words with control of a central processing unit of a computer wherein N is an integer relating to a storage unit of a computer, said apparatus comprising:

a pointer for indicating a word start address of a word of image data bits under processing;
   detection means for receiving image data bits of said word and for detecting a presence of a run-start bit and a presence of a run-end bit in said word in parallel; means for generating from a first signal in response to detection of the presence of a run-start bit and for generating a second signal in response to detection of the presence of a run-end bit so as to generate said first and said second signals simultaneously;
   a run-start level generator for receiving said image data bits of said word under processing and being activated in response to generation of said first signal for generating run-start levels therefrom, by designating each of the run-start bits in said word as a first binary level and each of the other bits in the word as a second binary level;
   a run-end level generator for receiving said image data bits of said word under processing and being activated in response to generation of said second signal for generating run-end levels therefrom by designating each of the run-end bits in the word as a first binary level and each of the other bits in the word as a second binary level;
   a first and a second trap circuit connected to said run-start level generator and said run-end level generator respectively for converting the run-start levels and the run-end levels to a plurality of trapped run-start word position pulses and a plurality of trapped run-end word position pulses;
   a first and a second encoder connected to the first and the second trap circuits respectively for encoding the plurality of trapped run-start word position pulses and the plurality of trapped run-end word position pulses into serial run-start word addresses and serial run-end word addresses;
   a first and a second adding circuit connected to the first and second encoders respectively for receiving the serial run-start word addresses and the serial run-end word addresses and also connected to said pointer for receiving said word start address, the first and second adding circuits adding the word start address to the serial run-start word addresses and to the serial run-end word addresses respectively to derive serial run-start row addresses and serial run-end row addresses;
   first and second memory means for storing said serial run-start row addresses and serial run-end row addresses respectively so that a central processing unit in said image processing system can access said serial run-start addresses and said serial run-end addresses for further image processing.

6. Apparatus according to claim 5 further comprising a ripple counter connected to said first trap circuit for deriving a crossing count parameter by counting the trapped run-start word position pulses generated in a row of image data.

7. Apparatus according to claim 5 further comprising a ripple counter connected to said second trap circuit for deriving a crossing count parameter by counting the trapped run-end word position pulses generated in a row of image data.

8. Apparatus according to claim 5 wherein said detection means generates an interrupt signal to inform the central processing unit to load in a succeeding word on detection of a lack of both run-start bits and run-end bits in said word under processing.

9. Apparatus according to claim 5 wherein said pointer updates a word start address for indicating the position of a succeeding word by adding the integer N.

10. Apparatus according to claim 5, wherein each of the first and the second trap circuits is composed of N stages and forms a data flow hardware architecture, each of said stage comprising a pulse steering circuit, means for generating a pulse and latch means for trapping a pulse.

11. Apparatus according to claim 5, wherein each of said first and second memory means comprises a pipeline of first-in first-out registers.

12. A run-length code processing method of generating in parallel run-start row addresses and run-end row addresses of all black runs in a row of digitized image data, the image data being loaded in by units of words from a central processing unit (CPU), the method comprising the steps of:
(a) detecting in parallel run-start and run-end bits of all the black runs in at least one of the words;
(b) converting the detected run-start and run-end bits respectively into run-start and run-end addresses in a row of the image data;
(c) storing the run-start and run-end addresses in two pipelines of first-in-first-out registers;
(d) effecting steps (a) and (b) without intervention from the CPU and effecting step (c) so as to enable access by the CPU for further image processing; and
acquiring a crossing count during step (b), the crossing count being a total number of change times from white to black information in the digitized image data and being indicative of a total number of the black runs.

13. A run-length code processing method of generating in parallel run-start row addresses and run-end row addresses of all black runs in a row of digitized image data, the image data being loaded in by units of words from a central processing unit (CPU), the method comprising the steps of:
(a) detecting in parallel run-start and run-end bits of all the black runs in at least one of the words;
(b) converting the detected run-start and run-end bits respectively into run-start and run-end addresses in a row of the image data;
(c) storing the run-start and run-end addresses in two pipelines of first-in-first-out registers;
(d) effecting steps (a) and (b) without intervention from the CPU and effecting step (c) so as to enable access by the CPU for further image processing;
detecting a condition in which there is an absence of a run start bit and a run end bit in the one word, the run start bit being a bit whose value is one where a value of an immediately preceding bit is zero, the run end bit being a bit whose value is zero where a value of an immediately preceding bit is one; and informing the CPU in response to the detection of the condition to load in the image data of the next word.

14. A method as in claim 13, wherein the step of informing includes generating an interrupt message.

15. A run-length code processing apparatus useful for generating in parallel run-start row addresses and run-end row addresses of all black runs in a row of digitized image data, the image data being loaded in by units of words to be processed from a central processing unit (CPU), the apparatus comprising:
means for detecting in parallel run-start and run-end bits of all the black runs in at least one of the words to be processed;
means for converting the detected run-start and run-end bits respectively into run-start and run-end addresses in a row of the image data;
means for storing the run-start and run-end addresses in two pipelines of first-in-first-out registers;
means for effecting operation of said detecting means and said converting means without intervention from the CPU;
means for enabling access of said storing means by the CPU for further image processing; and
acquiring a crossing count in response to operation of said converting means, the crossing count being a total number of change times from white to black information in the digitized image data and being indicative of a total number of the black runs.

16. An apparatus as in claim 15, wherein said converting means includes in parallel a run-start address generator and a run-end address generator, said run-start address generator having in series a run-start level generator for generating run-start levels, a run-start trap circuit for trapping said levels, and an encoder for encoding output from said run-start trap circuit, said run-end address generator having in series a run-end level generator for generating run-end levels, a run-end trap circuit for trapping said run-end levels, and an encoder for encoding output from said run-end trap circuit, said acquiring means being responsive to said output from one of said run-start and run-end trap circuits for acquiring said crossing count.

17. An apparatus as in claim 16, wherein said each of said run-start and run-end address generators have a respective adding circuit in series connection between a respective one of said trap circuits and a respective one of said two pipelines of first-in first-out registers, further comprising:
a pointer for indicating word start address, which is a position of a first bit of the word to be processed in the row of image data, said encoder of said run-start generator generating serial run-start word addresses each indicative of the position of the run-start bit in the word, said adding circuit of said run-start address generator being for adding said serial run-start word addresses with word start addresses from a pointer, said adding circuit of said run-end address generator being for adding said serial run-end word addresses with said word start addresses from said pointer.

18. A run-length code processing apparatus useful for generating in parallel run-start row addresses and run-end row addresses of all black runs in a row of digitized image data, the image data being loaded in by units of words to be processed from a central processing unit (CPU), the apparatus comprising:

means for detecting in parallel run-start and run-end bits of all the black runs in at least one of the words to be processed;

means for converting the detected run-start and run-end bits respectively into run-start and run-end addresses in a row of the image data;

means for storing the run-start and run-end addresses in two pipelines of first-in-first-out registers;

means for effecting operation of said detecting means and said converting means without intervention from the CPU;

means for enabling access of said storing means by the CPU for further image processing;

means for detecting a condition in which there is an absence of a run start bit and a run end bit in the one word, the run start bit being a bit whose value is one where a value of an immediately preceding bit is zero, the run end bit being a bit whose value is zero where a value of an immediately preceding bit is one; and means for informing the CPU in response to the detection of the condition to load in the image data of the next word.

19. An apparatus as in claim 18, wherein said informing means includes means for generating an interrupt message.

* * * * *